United States Patent
Liu et al.

(10) Patent No.: US 10,615,249 B2
(45) Date of Patent: Apr. 7, 2020

(54) CAPACITOR STRUCTURES AND METHODS FOR FABRICATING THE SAME

(71) Applicant: Vanguard International Semiconductor Corporation, Hsinchu (TW)

(72) Inventors: Hsing-Chao Liu, Jhudong Township (TW); Li-Che Chen, Hsinchu (TW); Chien-Hsien Song, Kaohsiung (TW); Shu-Wei Hsu, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/039,763

(22) Filed: Jul. 19, 2018

(65) Prior Publication Data

US 2020/0027946 A1  Jan. 23, 2020

(51) Int. Cl.
*H01L 49/02* (2006.01)
*H01L 23/522* (2006.01)
(Continued)

(52) U.S. Cl.
CPC ........ *H01L 28/60* (2013.01); *H01L 21/31111* (2013.01); *H01L 21/76807* (2013.01);
(Continued)

(58) Field of Classification Search
CPC .............. H01L 28/60; H01L 21/31111; H01L 21/76807; H01L 21/76877; H01L 23/5223; H01L 23/5226; H01L 23/528
(Continued)

(56) References Cited

U.S. PATENT DOCUMENTS

| 2015/0102337 A1* | 4/2015 | Lou ........................ H01L 27/124 257/43 |
| 2016/0005805 A1* | 1/2016 | Huang .............. H01L 21/31111 257/532 |
| 2019/0157378 A1* | 5/2019 | Luo .......................... H01L 28/40 |

FOREIGN PATENT DOCUMENTS

| TW | 494527 B | 7/2002 |
| TW | 200503278 A | 1/2005 |
| TW | 201351484 A | 12/2013 |

OTHER PUBLICATIONS

Taiwanese Office Action and Search Report, dated Oct. 29, 2018, for Taiwanese Application No. 107116989.

* cited by examiner

*Primary Examiner* — Tu-Tu V Ho (74) *Attorney, Agent, or Firm* — Birch, Stewart, Kolasch & Birch, LLP (57) ABSTRACT

A capacitor structure includes a first electrode plate disposed on a substrate, a first capacitor dielectric layer disposed on the first electrode plate, and a second electrode plate disposed on the first capacitor dielectric layer. A portion of the first electrode plate extends beyond an end of the second electrode plate to form a step. The capacitor structure also includes an etching stop layer, an inter-metal dielectric layer, a first via and a second via. The etching stop layer is disposed on the second electrode plate. The inter-metal dielectric layer covers the etching stop layer, the second electrode plate, the first capacitor dielectric layer and the first electrode plate. The first via penetrates through the inter-metal dielectric layer to contact the first electrode plate at the portion extending beyond the second electrode plate. The second via penetrates through the inter-metal dielectric layer to contact the second electrode plate.

15 Claims, 8 Drawing Sheets

(51) Int. Cl.
  *H01L 23/528*  (2006.01)
  *H01L 21/768*  (2006.01)
  *H01L 21/311*  (2006.01)
(52) U.S. Cl.
  CPC ...... *H01L 21/76877* (2013.01); *H01L 23/528* (2013.01); *H01L 23/5223* (2013.01); *H01L 23/5226* (2013.01)
(58) Field of Classification Search
  USPC ........................................................ 257/532
  See application file for complete search history.

CAPACITOR STRUCTURES AND METHODS FOR FABRICATING THE SAME

BACKGROUND

Technical Field

The disclosure relates to capacitor structures, and more particularly, to metal-insulator-metal (MIM) capacitor structures and methods for fabricating the same.

Description of the Related Art

Generally, capacitor structures are used in electrical passive elements in semiconductor integrated circuits (IC), such as radio frequency circuits and mixed signal circuits. The types of conventional capacitor structures used in semiconductor integrated circuits include metal-insulator-semiconductor (MIS) capacitors, PN junction capacitors, and polysilicon-insulator-polysilicon (PIP) capacitors.

However, conventional capacitor structures use semiconductor layers (such as polysilicon) as capacitance electrodes, and thus traditional capacitor structures have high serial resistances and have the disadvantage of being less stable in high-frequency circuits. Moreover, during operation, the electrodes of PN junction capacitors generate depletion layers that results in limited frequency characteristics. Compared to those traditional capacitors, MIM capacitor structures can provide lower serial resistance and low power dissipation characteristics, and thus MIM capacitor structures are suitable for today's mixed signal circuit and high-frequency circuit applications. In addition, MIM capacitor structures can be formed during the formation of the metal interconnections in semiconductor fabrication process, which reduces the difficulty and complexity of integrating capacitor structures into the front-end-of-line (FEOL) process of complementary metal oxide semiconductors (CMOS).

Semiconductor integrated circuits have undergone rapid development in order to scale down the dimensions of semiconductor elements. However, in the continuously shrinking areas, MIM capacitance structures are required to maintain high capacitance, and therefore the processes for forming MIM capacitance structures also face various new challenges.

SUMMARY

Some embodiments of the present disclosure provide a capacitor structure. The capacitor structure includes a first electrode plate disposed on a substrate, a first capacitor dielectric layer disposed on the first electrode plate, and a second electrode plate disposed on the first capacitor dielectric layer. A portion of the first electrode plate extends beyond an end of the second electrode plate to form a step. The capacitor structure also includes an etching stop layer, an inter-metal dielectric layer, a first via and a second via. The etching stop layer is disposed on the second electrode plate. The inter-metal dielectric layer covers the etching stop layer, the second electrode plate, the first capacitor dielectric layer and the first electrode plate. The first via penetrates through the inter-metal dielectric layer to contact the first electrode plate at the portion extending beyond the second electrode plate. The second via penetrates through the inter-metal dielectric layer to contact the second electrode plate.

Some embodiments of the present disclosure provide a capacitor structure. The capacitor structure includes a first electrode plate disposed on a substrate, a first capacitor dielectric layer disposed on the first electrode plate, and a second electrode plate disposed on the first capacitor dielectric layer. A portion of the first electrode plate extends beyond an end of the second electrode plate to form a step. The first electrode plate includes a first anti-reflective coating and the second electrode plate includes a second anti-reflective coating. A thickness of the second anti-reflective coating is less than a thickness of the first anti-reflective coating. The capacitor structure also includes an inter-metal dielectric layer, a first via and a second via. The inter-metal dielectric layer covers the second electrode plate, the first capacitor dielectric layer and the first electrode plate. The first via penetrates through the inter-metal dielectric layer to contact the first electrode plate at the portion extending beyond the second electrode plate. The second via penetrates through the inter-metal dielectric layer to contact the second electrode plate.

Some embodiments of the present disclosure provide a method for fabricating a capacitor structure. The method includes sequentially forming a first electrode plate material layer, a first dielectric layer, a second electrode plate material layer and a first etching stop layer on a substrate, patterning the first etching stop layer and the second electrode plate material layer to form a patterned first etching stop layer and a second electrode plate respectively, and patterning the first dielectric layer and the first electrode plate material layer to form a first capacitor dielectric layer and a first electrode plate respectively, wherein a portion of the first electrode plate extends beyond an end of the second electrode plate to form a step. The method also includes forming an inter-metal dielectric layer to cover the patterned first etching stop layer, the second electrode plate, the first capacitor dielectric layer and the first electrode plate, forming a first opening to penetrate through the inter-metal dielectric layer until the portion of the first electrode plate which extends beyond the second electrode plate is exposed, forming a second opening to penetrate through the inter-metal dielectric layer and the patterned first etching stop layer until the second electrode plate is exposed, and forming a first via in the first opening and a second via in the second opening.

The capacitance structures of the present disclosure can be applied to various types of capacitance structures. In order to make features and advantages of the present disclosure easy to understand, a detailed description is given in the following embodiments used in MIM capacitance structures with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn to scale, wherein.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of some embodiments are discussed below. Throughout the various views and illustrative embodiments, like reference numbers are used to designate like elements. It should be understood that additional operations can be provided before, during, and after the method, and some of the operations described can be replaced or eliminated for other embodiments of the method.

The present disclosure provides capacitor structures and methods for fabricating the same, particularly suitable for MIM capacitor structures. However, the embodiments of the present disclosure may also be used in other capacitor structures, such as MIS capacitors, PN junction capacitors and PIP capacitors.

In conventional processes for fabricating stacked capacitor structures, since electrode plates of a capacitor structure are located at different layer-levels, an etching process for forming via openings which correspond to respective electrode plates results in an under-etching or an over-etching. The embodiments of the present disclosure adjust thicknesses of etching stop layers formed on electrode plates and/or of anti-reflective coatings of electrode plates, which are increased as layer-levels of electrode plates are increased, and thus in cases where the etching time is the same, the difference between the etching depths can be compensated for by the difference between the thicknesses of etching stop layers formed on electrode plates and/or between the thicknesses of anti-reflective coatings of electrode plates. Therefore, the embodiments of the present disclosure can use one etching process to form multiple via openings having different depths to respective electrode plates, which may reduce the time and cost of forming capacitor structures.

Figure 1A:
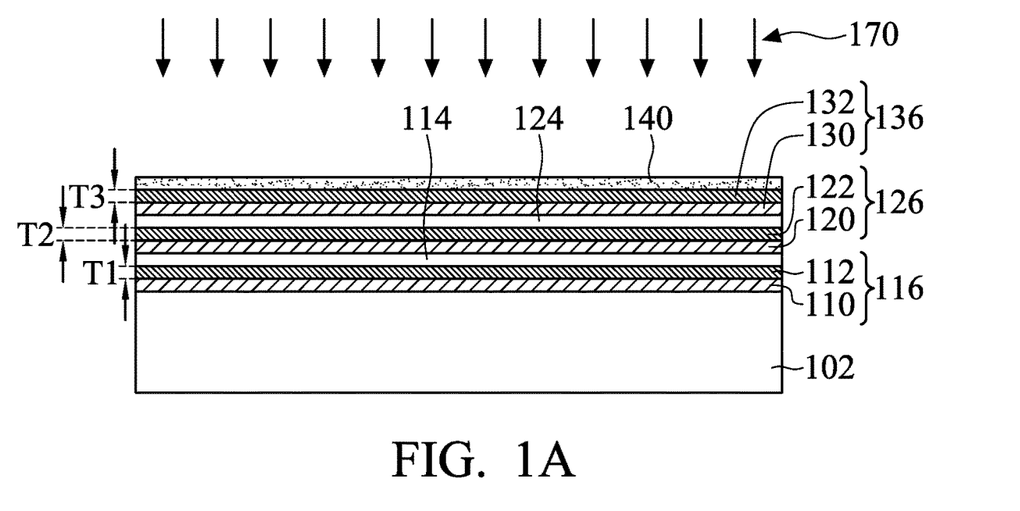
FIGS. 1A-1H illustrate cross-sectional views of forming a capacitor structure at intermediate stages in accordance with some embodiments of the present disclosure.
Figure 1B:
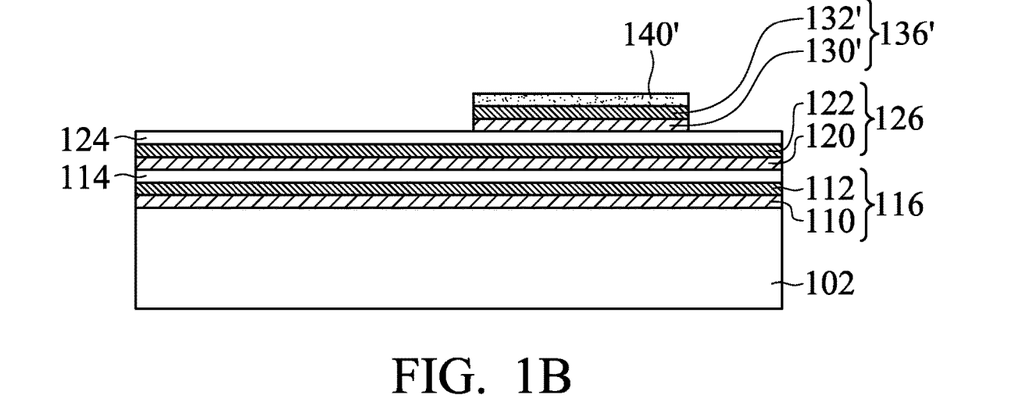
Figure 1C:
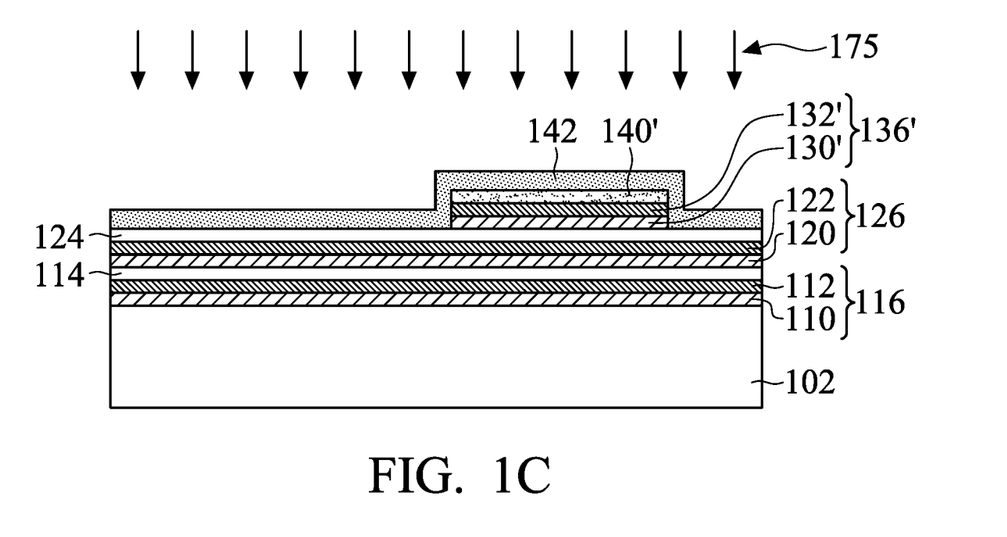
Figure 1D:
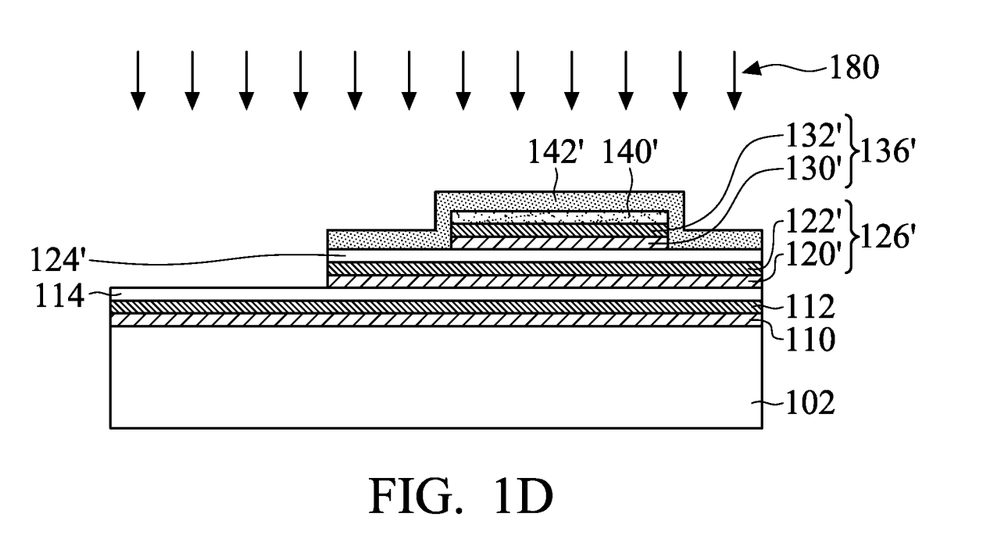
Figure 1E:
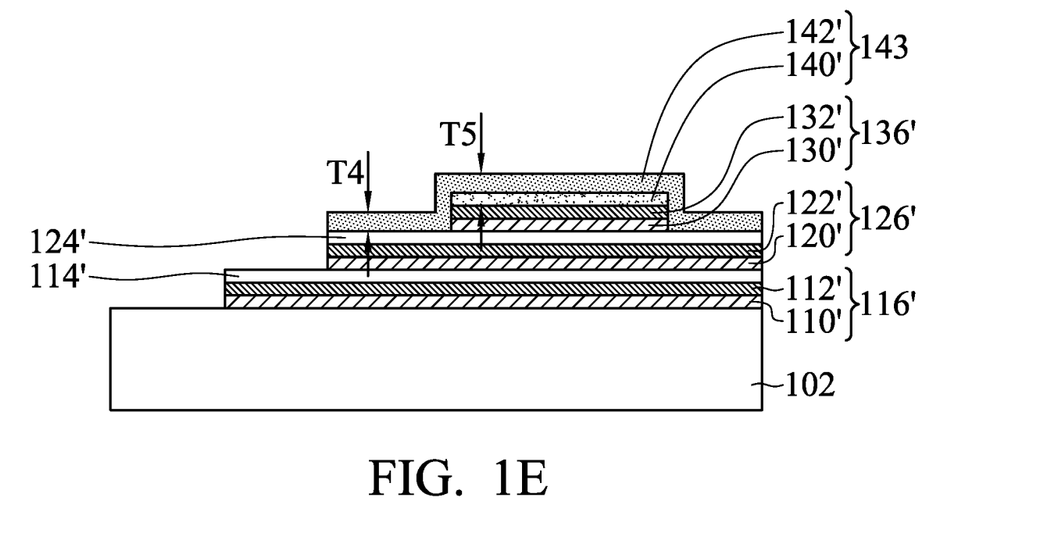
Figure 1F:
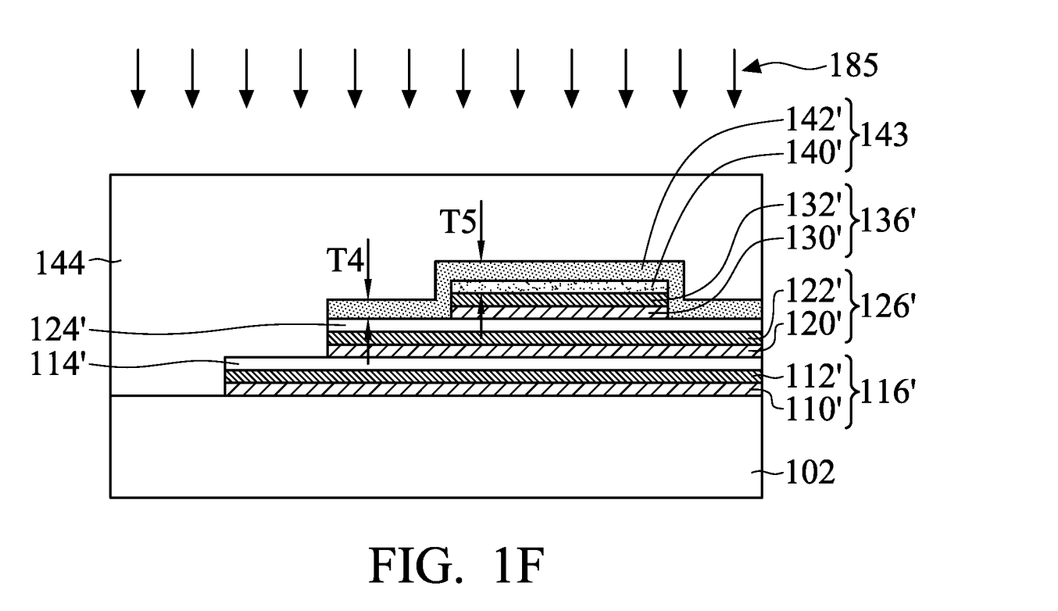
Figure 1G:
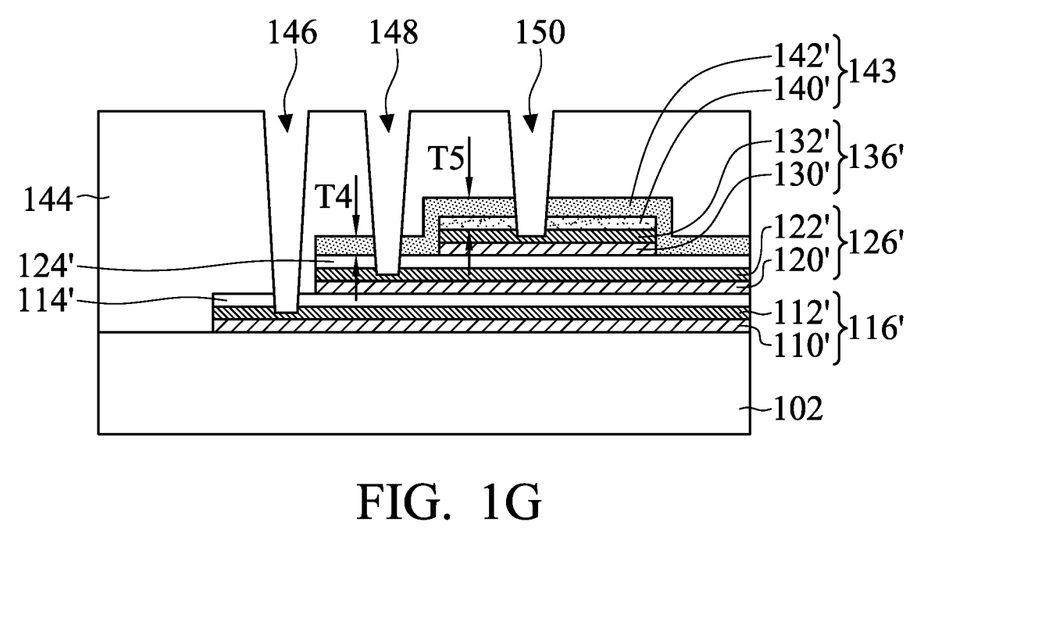
Figure 1H:
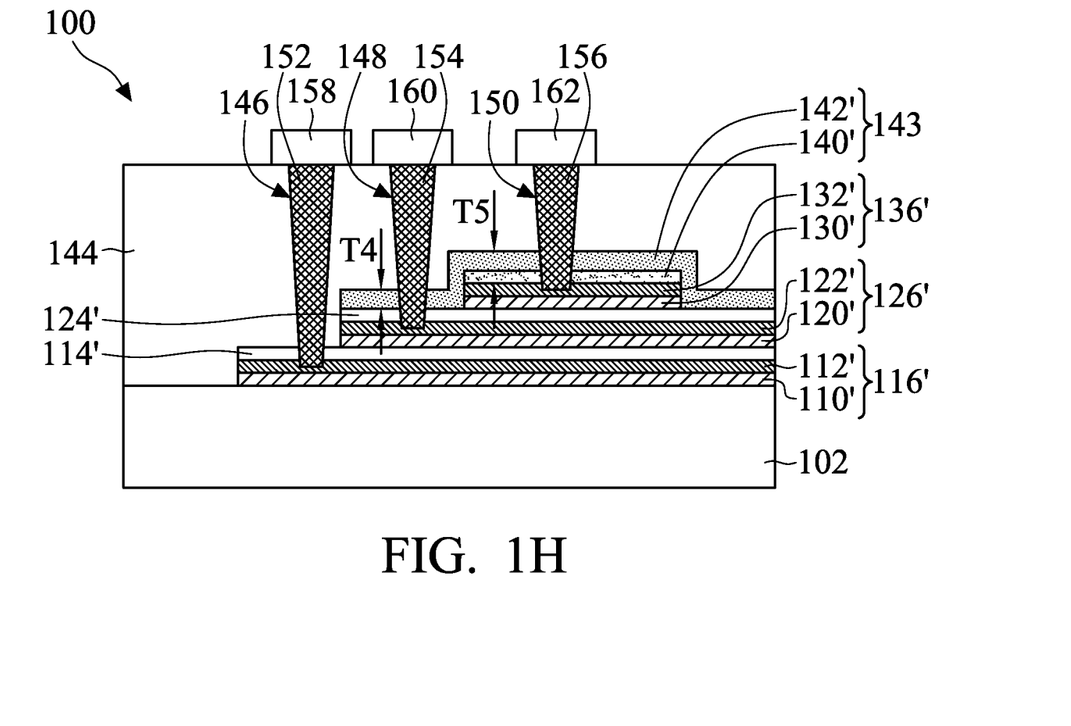

FIGS. 1A-1H illustrate cross-sectional views of forming a capacitor structure 100 shown in FIG. 1H at intermediate stages in accordance with some embodiments of the present disclosure. Referring to FIG. 1A, a substrate 102 is provided. The substrate 102 may be any substrate used to formed capacitor structures thereon. In some embodiments, the substrate 102 may a silicon substrate, a silicon germanium (SiGe) substrate, a bulk semiconductor substrate, a compound semiconductor substrate, a silicon-on-insulator (SOI) substrate, or the like. In an embodiment, the substrate 102 is a silicon substrate, and the substrate 102 may include active elements (not shown), such as transistors, diodes, or the like. In addition, the substrate 102 may include metallic interconnect structures, such as inter-layer dielectric (ILD) layers, contact plugs, inter-metal dielectric (IMD) layers, metal lines, and vias. In order to simplify the diagrams, herein only a flat substrate 102 is depicted.

Next, a first electrode plate material layer 116 is formed on the substrate 102. The first electrode plate material layer 116 includes a first metal layer 110 and a first anti-reflective coating 112 formed thereon. In some embodiments, the material of the first metal layer 110 may be or include aluminum (Al), copper (Cu), ruthenium (Ru), silver (Ag), gold (Au), rhenium (Rh), molybdenum (Mo), nickel (Ni), cobalt (Co), titanium (Ti), tungsten (W), the like, an alloy thereof, or a combination thereof. The first metal layer 110 may be formed by any suitable deposition method, such as physical vapor deposition (PVD), sputtering, chemical vapor deposition (CVD), atomic layer deposition (ALD), electroplating or a combination thereof. In an embodiment, the first metal layer 110 includes AlCu alloy and has a thickness in a range from about 300 Å to about 10000 Å. In some embodiments, the material of the first anti-reflective coating 112 may be a metal nitride, such as titanium nitride (TiN), tantalum nitride (TaN), the like, or a combination thereof. The first anti-reflective coating 112 may be formed by any suitable deposition method, such as PVD, sputtering, CVD, ALD, or a combination thereof. In an embodiment, the first anti-reflective coating 112 includes TiN and has a first thickness T1 that is in a range from about 100 Å to about 2000 Å.

Next, a first dielectric layer 114 is formed on the first electrode plate material layer 116. In some embodiments, the first dielectric layer 114 may be a high-k dielectric material, and the k value of the first dielectric layer 114 depends on the design. In some embodiments, the material of the first dielectric layer 114 may be or include silicon oxide ($SiO_2$), silicon nitride (SiN), silicon oxynitride (SiON), titanium oxide ($TiO_2$), tantalum oxide ($Ta_2O_5$), aluminum oxide ($Al_2O_3$), Hafnium oxide (HfO), the like, a multilayer thereof (such as oxide-nitride-oxide (O—N—O) layers), or a combination thereof. The first dielectric layer 114 may be formed by any suitable deposition method, such as PVD, CVD, plasma enhanced CVD (PECVD), ALD, sputtering, or a combination thereof.

Next, a second electrode plate material layer 126 is formed on the first dielectric layer 114. The second electrode plate material layer 126 includes a second metal layer 120 and a second anti-reflective coating 122 formed thereon. The second dielectric layer 124 is then formed on the second electrode plate material layer 126. In some embodiments, the materials and the formation methods of the second metal layer 120, the second anti-reflective coating 122 and the second dielectric layer 124 may be the same as or similar to those of the first metal layer 110, the first anti-reflective coating 112 and the first dielectric layer 114 as described above. In an embodiment, the second metal layer 120 includes AlCu alloy and has a thickness that is in a range from about 100 Å to about 3000 Å. In an embodiment, the second anti-reflective coating 122 may include TiN, and has a second thickness T2 that is in a range from 100 Å to about 2000 Å.

Next, a third electrode plate material layer 136 is formed on the second dielectric layer 124. The third electrode plate material layer 136 includes a third metal layer 130 and a third anti-reflective coating 132 formed thereon. In some embodiments, the materials and the formation methods of the third metal layer 130 and the third anti-reflective coating 132 may be the same as or similar to those of the first metal layer 110 and the first anti-reflective coating 112 as described above. In an embodiment, the third metal layer 130 includes AlCu alloy and has a thickness in a range from about 100 Å to about 3000 Å. In an embodiment, the third anti-reflective coating 132 may include TiN, and has a third thickness T3 that is in a range from about 100 Å to about 2000 Å.

The first anti-reflective coating 112 of the first electrode plate material layer 116 has a first thickness T1, the second anti-reflective coating 122 of the second electrode plate material layer 126 has a second thickness T2, and the third anti-reflective coating 132 of the third electrode plate material layer 136 has a third thickness. In some embodiments, the first thickness T1, the second thickness T2 and the third thickness T3 may be equal to each other. In some other embodiments, the first thickness T1, the second thickness T2 and the third thickness T3 may not be equal to each other.

Still referring to FIG. 1A, a first etching stop layer 140 is formed on the third electrode plate material layer 140. In some embodiments, the material of the first etching stop layer 140 may be or include silicon oxide ($SiO_2$), silicon nitride (SiN), silicon oxynitride (SiON), the like, a multi-layer thereof (such as oxide-nitride-oxide (O—N—O) layer), or a combination thereof. The first etching stop layer 140 may be formed by any suitable deposition method, such as PVD, CVD, PECVD, ALD or sputtering.

Next, a first patterning process 170 is performed on the first etching stop layer 140, the third anti-reflective coating 132 and the third metal layer 130. After the first patterning process 170, a patterned first etching stop layer 140', a third anti-reflective coating 132' and a third metal layer 130' are formed, and a portion of the second dielectric layer 124 is exposed, as shown in FIG. 1B. After the first patterning process 170, the third metal layer 130' and the third anti-reflective coating 132' in combination serve as a third electrode plate 136'.

In some embodiments, the steps of the first patterning process 170 may include forming a patterned photoresist layer (not shown) on the first etching stop layer 140 by a photolithography process, performing an etching process, such as a dry etching or a wet etching, on the first etching stop layer 140, the third anti-reflective coating 132 and the third metal layer 130 to remove portions of the first etching stop layer 140, the third anti-reflective coating 132 and the third metal layer 130 which are uncovered by the patterned photoresist layer, and to expose the second dielectric layer 124. Afterward, the patterned photoresist layer on the first etching stop layer 140' is removed. In some embodiments, the etching process of the first patterning process 170 may a single etching process to etch all material layers. In some other embodiments, the etching process of the first patterning process 170 may be multiple etching processes for respective material layers. In addition, since the etching process of the patterning process 170 uses the second dielectric layer 124 as an etching stop layer, the second dielectric layer 124 may be slightly etched.

Referring to FIG. 1C, a second etching stop layer 142 is formed on the structure as shown in FIG. 1B. The second etching stop 142 is conformally formed on the exposed upper surface of the second dielectric layer 124, the sidewalls of the third electrode plate 136' (including the third metal layer 130' and the third anti-reflective coating 132'), and the sidewalls and upper surface of the first etching stop layer 140'. The second etching stop layer 142 has a first horizontal portion on the exposed upper surface of the second dielectric layer 124, a second horizontal portion on the upper surface of the first etching stop layer 140', and a vertical portion on the sidewalls of the third electrode plate 136' and the first etching stop layer 140. In some embodiments, the thickness of the first horizontal portion of the second etching stop layer 142 is from about 0.3 to about 1.0, such as 0.5 of that of the second horizontal portion of the second etching stop layer 142. The thickness of the vertical portion of the second etching stop layer 142 is about from 0.5 to 0.9, such as 0.7 of that of the second horizontal portion of the second etching stop layer 142. In some embodiments, the material and formation method of the second etching stop layer 142 may be the same as or similar to those of the first etching stop layer 140 described above.

Next, a second patterning process 175 is performed on the second etching stop layer 142, the second dielectric layer 124, the second anti-reflective coating 122 and the second metal layer 120. As shown in FIG. 1D, after the second patterning process 175, a patterned etching stop layer 142', a second capacitor dielectric layer 124', a second anti-reflective coating 122' and a second metal layer 120' are formed, and a portion of the first dielectric layer 114 is exposed. After the second patterning process 175, the second metal layer 120' and the second anti-reflective coating 122' in combination serve as a second electrode plate 126'. Portions of the second capacitor dielectric layer 124' and the second electrode plate 126' extend beyond the third electrode plate 136' to form a step. In some embodiments, the second patterning process 175 may be similar to the first patterning process 170 as described above with respect to FIG. 1A.

Next, a third patterning process 180 is performed on the first dielectric layer 114, the first anti-reflective coating 112 and the first metal layer 110. As shown in FIG. 1E, after the third patterning process 180, a first capacitor dielectric layer 114', a first anti-reflective coating 112' and a first metal layer 110' are formed, and the upper surface of the substrate 102 (or a topmost IMD layer of which) is exposed. After the third patterning process 180, the first metal layer 110' and the first anti-reflective coating 112' in combination serve as a first electrode plate 116'. Portions of the first capacitor dielectric layer 114' and the first electrode plate 116' extend beyond the second electrode plate 126' to form a step. The third patterning process 180 may be similar to the first patterning process as described above with respect to FIG. 1A.

As shown in FIG. 1E, the first etching stop layer 140' and the second etching stop layer 142' in combination are referred to as an etching stop layer 143. The etching stop layer 143 has a first horizontal portion formed on the portion of the second electrode plate 126' which extends beyond the third electrode plate 136', and a second horizontal portion formed on the third electrode plate 136'. The first horizontal portion of the etching stop layer 143 has a fourth thickness T4, and the second horizontal portion of the etching stop layer 144 has a fifth thickness T5 which is greater than the fourth thickness T4. For example, the fifth thickness T5 is in a range from about 1.0 to about 5 times, such as 1.5 times the fourth thickness T4. In the embodiments shown in FIG. 1E, no etching stop layer is formed on the first electrode plate 116'.

Referring to FIG. 1F, an inter-metal dielectric (IMD) layer 144 is formed on the substrate 102. The IMD layer 144 covers the etching stop layer 143, the third electrode plate 136', the second capacitor dielectric layer 124', the second electrode plate 126', the first capacitor dielectric layer 114', and the first electrode plate 116'. In some embodiments, the material of the IMD layer 144 may be or include silicon oxide ($SiO_2$), silicon nitride (SiN), silicon oxynitride (SiON), silicon carbide (SiC), silicon carbonitride (SiCN), the like, a multilayer thereof, or a combination thereof. The IMB layer 144 may be formed by any suitable method such as PVD, CVD, PECVD, ALD, sputtering or a combination thereof.

In some embodiments, in a subsequent etching process for forming openings 146, 148 and 150 (shown in FIG. 1G), the etching stop layer 143 has higher etching selectivity than the IMD layer 144. That is to say, the etch stop layer 143 has a lower etching rate than that of the 1 MB layer 144. For example, the etching selective ratio of the first etching stop layer 140 to the IMD layer 144 is from about 3 to about 10. In some embodiments, in a subsequent etching process for forming openings 146, 148 and 150 (shown in FIG. 1G), the capacitor dielectric layers 114' and 124' have a similar etching selectivity to that of the IMD layer 144.

Next, a fourth patterning process is performed on the IMD layer 144. As shown in FIG. 1G, after the fourth patterning process, a first opening 146, a second opening 148 and a third opening 150 are formed. The first opening 146 penetrates through the IMD layer 144 and the first capacitor dielectric layer 114' until the portion of the first electrode plate 116' which extends beyond the second electrode plate 126' is exposed. The second opening 148 penetrates through the IMD layer 144 and the etching stop layer 143 and the second capacitor dielectric layer 124' until the portion of the second electrode plate 126' which extends beyond the third electrode plate 136' is exposed. The third opening 150 penetrates through the IMD layer 144 and the etching stop layer 143 until the third electrode plate 136' is exposed.

In some embodiments, the steps of the fourth patterning process 185 may include forming a patterned photoresist layer (not shown) on the IMD layer 140 by a photolithography process, performing an etching process, such as a dry etching or a wet etching, on the IMD layer 140 to remove a portion of the IMD layer 144 uncovered by the patterned photoresist layer and to form the first opening 146, the second opening 148 and the third opening 150. In some embodiments, the etching process of the fourth patterning process 185 is an anisotropic etching process, such as reactive ion etch (RIE), neutral beam etch (NBE), the like or a combination thereof. The etching process may use etching gas including $CF_4$, $CHF_3$, $CH_2F_2$, $CH_3F_8$, $C_4F_8$, $C_5F_8$, $NF_3$, $SF_6$ or a combination thereof. In some embodiments, the etching process of the fourth patterning process 185 is a wet etching process, such as using dilute hydrofluoric acid (dHF). During the etching process, the first opening 146 penetrates through the first capacitor dielectric layer 114' and further extends into the first electrode plate 116'. The second opening 148 penetrates through the first horizontal portion of the etching stop layer 143 and the second capacitor dielectric layer 124' and further extends into the second electrode plate 126'. The third opening 150 penetrates through the second horizontal portion of the etching layer 143 and further extends into the electrode plate 136'. Afterward, the patterned photoresist layer on the IMD layer 144 is removed, such as by an ashing process. In some embodiments, the openings 146, 148 and 150 may stop at the anti-reflective coatings 112', 122' and 132' respectively. In some other embodiments, the openings 146, 148 and 150 may stop at the metal layers 110', 120' and 130' respectively, and not penetrate.

In the embodiments of the present disclosure, the first opening 146, the second opening 148 and the third opening 150 are formed simultaneously in the fourth patterning process 185. In cases where there is no etching stop layer 143 to be formed, since the first electrode plate 116', the second electrode plate 126' and the third electrode plate 136' are located at different layer-levels, when the first opening 146 extends into the first electrode plate 116', the third opening 150 and the second opening 148 may penetrate through the third electrode plate 136' and the second electrode plate 126' respectively.

In the embodiments of the present disclosure, the etching stop layer 143 has thicknesses on the electrode plates 116', 126' and 136' which are increased from zero (such as the etching stop layer 143 is not formed on the first electrode plate 116') as the layer-levels of the electrode plates are increased. For example, the fifth thickness T5 of the etching stop layer 143 on the third electrode plate 136' is from about 1.0 to about 5 times, such as about 1.5 times the fourth thickness T4 of the etching stop layer 143 on the second electrode plate 126'. Therefore, in cases where the etching time is the same, the difference between the etching depths between the first opening 146, the second opening 148 and the third opening 150 can be compensated for by the difference between the thicknesses of the etching stop layer 143 formed on the respective electrode plates 116', 126 and 136'. By adjusting the thicknesses of the first etching stop layer 140 and the second etching layer 142, the first opening 146, the second opening 148 and the third opening 150 can extend into the corresponding electrode plates 116', 126' and 136' simultaneously without penetrating them.

Referring to FIG. 1H, a first via 152, a second via 154 and a third via 156 are formed in the first opening 146, the second opening 148 and the third opening 150 respectively. The first via 152, the second via 154 and the third via 156 fill the first opening 146, the second opening 148 and the third opening 150, respectively. The first via 152, the second via 154 and the third via 156 are in contact with the first electrode plate 116', the second electrode plate 126' and the third electrode plate 136', respectively. In some embodiments, the material of the first via 152, the second via 154 and the third via 156 may be or include aluminum (Al), copper (Cu), ruthenium (Ru), silver (Ag), gold (Au), rhenium (Rh), molybdenum (Mo), nickel (Ni), cobalt (Co), titanium (Ti), tungsten (W), the like, an alloy thereof, or a combination thereof. The steps of forming the first via 152, the second via 154 and the third via 156 may include depositing a metal material layer (not shown) on the IMD layer 144 to fill the first opening 146, the second opening 148 and the third opening 150, and subsequently removing a portion of the metal material layer above the IMD layer 144 by a planarization process, such as chemical mechanical polish (CMP), to expose the upper surface of the IMD 144.

Still referring to FIG. 1H, a first terminal 158, a second terminal 160 and a third terminal 162 are formed on the upper surface of the IMD layer 144. The first terminal 158, the second terminal 160 and the third terminal 162 correspond to the first via 152, the second via 154 and the third via 156. The first terminal 158 is in electrical connection with the first electrode plate 116' through the first via 152, the second terminal 160 is in electrical connection with the second electrode plate 126' through the second via 154, and the third terminal 162 is in electrical connection with the third electrode plate 136' through the third via 156. After forming the first terminal 158, the second terminal 160 and the third terminal 162, a capacitor structure 100 is formed.

In some embodiments, the material of the first terminal 158, the second terminal 160 and the third terminal 162 may be or include aluminum (Al), copper (Cu), ruthenium (Ru), silver (Ag), gold (Au), rhenium (Rh), molybdenum (Mo), nickel (Ni), cobalt (Co), titanium (Ti), tungsten (W), the like, an alloy thereof, or a combination thereof. The steps of forming the first terminal 158, the second terminal 160 and the third terminal 162 may include depositing a metal material layer (not shown) over the IMD layer 144, and patterning the metal material layer to form the first terminal 158, the second terminal 160 and the third terminal 162 corresponding to the first via 158, the second via 160 and the third via 162 respectively. In some other embodiments, after forming the metal material layer for the vias 158, 160 and 162, portions of the metal material layer for the vias 158, 160 and 162 over the IMD layer 144 are patterned to form the first terminal 158, the second terminal 160 and the third terminal 162 without performing a planarization on the metal material layer for the vias 158, 160 and 162.

In some embodiments, when operating voltages are applied to the first terminal 158 and the second terminal 160, the first electrode plate 116', the first dielectric layer 114' and the second electrode plate 126' forms a first capacitor. In some embodiments, when operating voltages are applied to the second terminal 160 and third terminal 162, the second electrode plate 126', the second dielectric layer 124' and the third electrode plate 136' forms a second capacitor. In some embodiments, when operating a voltage is applied to the second terminal 160 and a common voltage is applied to the first electrode plate 116' and the third electrode plate 136', the first capacitor and the second capacitor as described above are connected in parallel to form a third capacitor having a higher capacitance than those of the first capacitor and the second capacitor.

In embodiments of the present disclosure, the capacitor structure 100 includes the first electrode plate 116', the first capacitor dielectric layer 114', the second electrode plate 126', the second capacitor dielectric layer 124', and the third electrode plate 136' sequentially stacked on the substrate 102. A portion of the first electrode plate 116' extends beyond one end of the second electrode plate 126' to form a step. A portion of the second electrode plate 126' extends beyond one end of the third electrode plate 136' to form another step.

The first electrode plate 116' includes the first metal layer 110' and the first anti-reflective coating 112'. The second electrode plate 126' includes the second metal layer 120' and the second anti-reflective coating 122'. The third electrode plate 136' includes the third metal layer 130' and the third anti-reflective coating 132'. In some embodiments, the thicknesses of the first anti-reflective coating 112', the second anti-reflective coating 122' and the third anti-reflective coating 132' are equal to each other. In some other embodiments, the thicknesses of the first anti-reflective coating 112', the second anti-reflective coating 122' and the third anti-reflective coating 132' are not equal to each other.

The capacitor structure 100 also includes the etching stop layer 143. The etching stop layer 143 has a horizontal portion disposed on the portion of the second electrode plate 126' which extends beyond one end of the third electrode plate 136', and a second horizontal portion disposed on the third electrode plate 136'. The second horizontal portion of the etching stop layer 143 includes the first etching stop layer 140' and the second electrode plate 142' and has the fifth thickness T5. The first horizontal portion of the etching stop layer 143 includes the second electrode plate 142' and has the fourth thickness T4 which is less than the fifth thickness T5. In some embodiments, no etching stop layer is disposed on the first electrode plate 116'.

The capacitor structure 100 also includes the IMD layer 144 covering the etching stop layer 143, the third electrode plate 136', the second capacitor dielectric layer 124', the second electrode plate 126', the first capacitor dielectric layer 114', and the first electrode plate 116'. The capacitor structure 100 also includes the first via 152, the second via 154 and the third via 156 which are in contact with the first electrode plate 116', the second electrode plate 126' and the third electrode plate 136' respectively. The first via 152 penetrates through the IMD layer 144 and the first capacitor dielectric layer 114' to contact the first electrode plate 116' at the portion extending beyond the second electrode plate 126'. The second via 154 penetrates through the IMD layer 144, the etching stop layer 143 and the second capacitor dielectric layer 124' to contact the second electrode plate 126' at the portion extending beyond the third electrode plate 136'. The third via 156 penetrates through the IMD layer 144 and the etching stop layer 143 to contact the third electrode plate 136'.

The embodiments of the present disclosure adjust thicknesses of the etching stop layers formed on the electrode plates which are increased as the layer-levels of the electrode plates are increased, and thus in a case of the same etching time, the difference between the etching depths can be compensated by the difference between the thicknesses of the etching stop layers formed on the electrode plates. Therefore, the embodiments of the present disclosure can use one etching process to form multiple via openings having different depths to respective electrode plates, which may reduce the time and costs of forming capacitor structures.

Figure 1I:
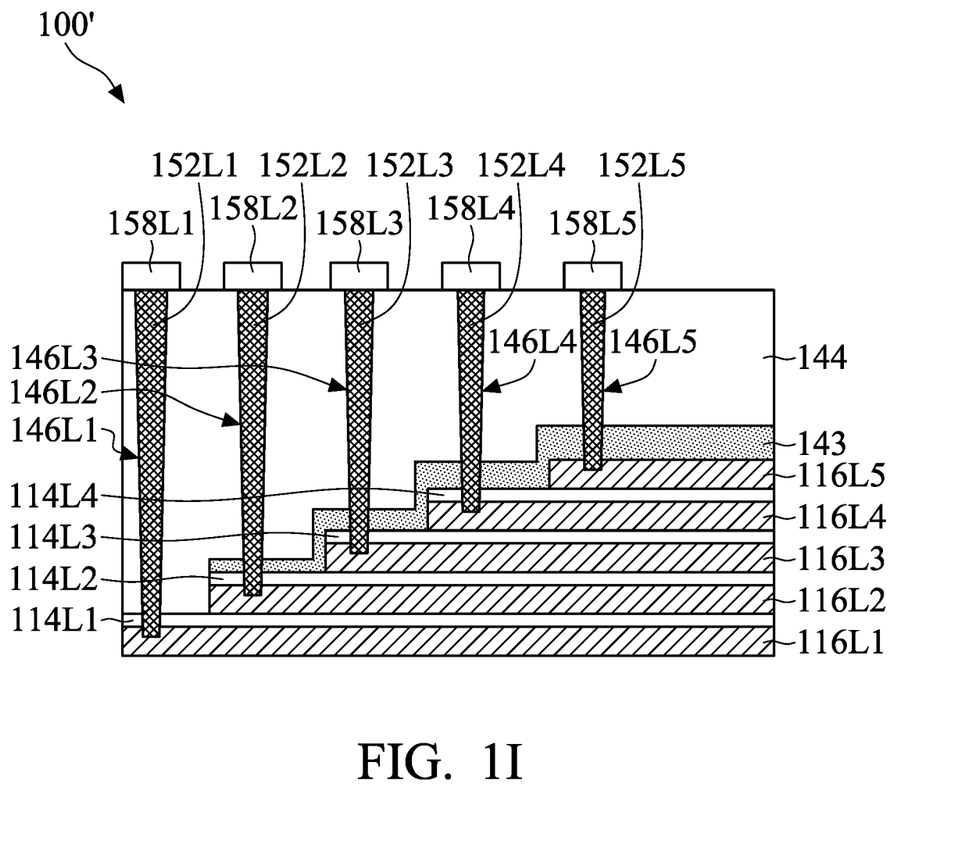
FIGS. 1I and 2-6 are cross-sectional views of capacitor structures in accordance with some other embodiments of the present disclosure.

Although the capacitor structure 100 has three layer-levels of the electrode plates 116', 126' and 136' in the embodiments as shown in FIG. 1H, the aspects of the present disclosure may be used to different layer-levels of electrode plates, such as two or more than three levels, so as to use one patterning process to form multiple via openings having different depths to respective electrode plates. For example, as shown in FIG. 1I, a capacitor 100' has five layer-levels of electrode plates 116L1-5 to 116L5. An etching stop layer 143 has thicknesses which are increased from zero (such as the etching stop layer 143 is not formed on the first layer-level of the electrode plate 116L1) as the layer-levels of electrode plates are increased (such as from the electrode plate 116L1 to electrode plate 115L5). For example, starting from the third level of electrode plate, the thickness of the etching stop layer 143 on a layer-level of electrode plate is from 1.2 to 5 times, such as 1.8 times, of the thickness of the previous layer-level of electrode plate. Therefore, by adjusting the thicknesses of the etching stop layer 143 formed on the respective electrode plates, the openings 146L1 to 146L5 can extend into the corresponding electrode plates 116L1 to 116L5 simultaneously without penetrating through the electrode plates.

Figure 2:
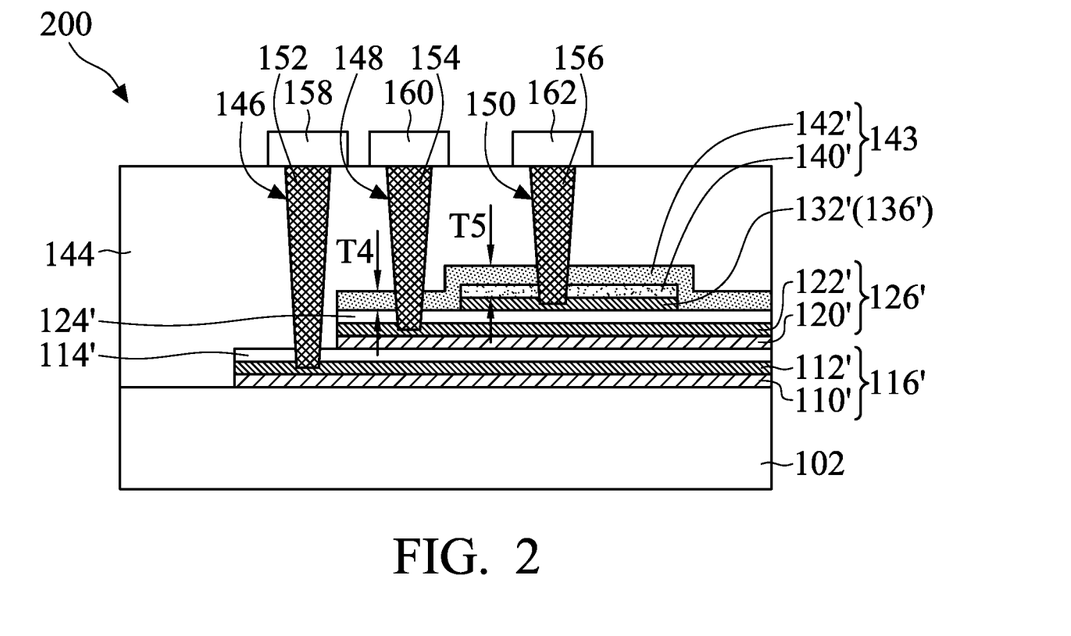

FIG. 2 is cross-sectional views of a capacitor structure 200 in accordance with some other embodiments of the present disclosure. Elements in FIG. 2 that are the same as those in FIGS. 1A-1H are labeled with the same reference numbers as in FIGS. 1A-1H and are not described again for brevity. The difference between the embodiments shown in FIGS. 2 and 1H is that the third electrode plate 136' of the capacitor structure 200 in the FIG. 2 is composed of the third anti-reflective coating 132'.

In some embodiments, the material of the third anti-reflective coating 132' of the third electrode plate 136' is a metal nitride with conductivity, such as TiN, TaN or the like. Therefore, the embodiments as shown in FIG. 2, the third electrode plate 136' may not include a metal layer, such as the third metal layer 130' as shown in FIG. 1H, and the third electrode plate 136' is only composed of the third anti-reflective coating 132'. Without forming the third metal layer 130', the overall thickness of the capacitor structure 200 can be reduced, which helps to reduce difficulties and complexities of integrating the capacitor structure 200 into front-end-of-line (FEOL) processes of the complementary metal oxide semiconductor (CMOS).

Figure 3:
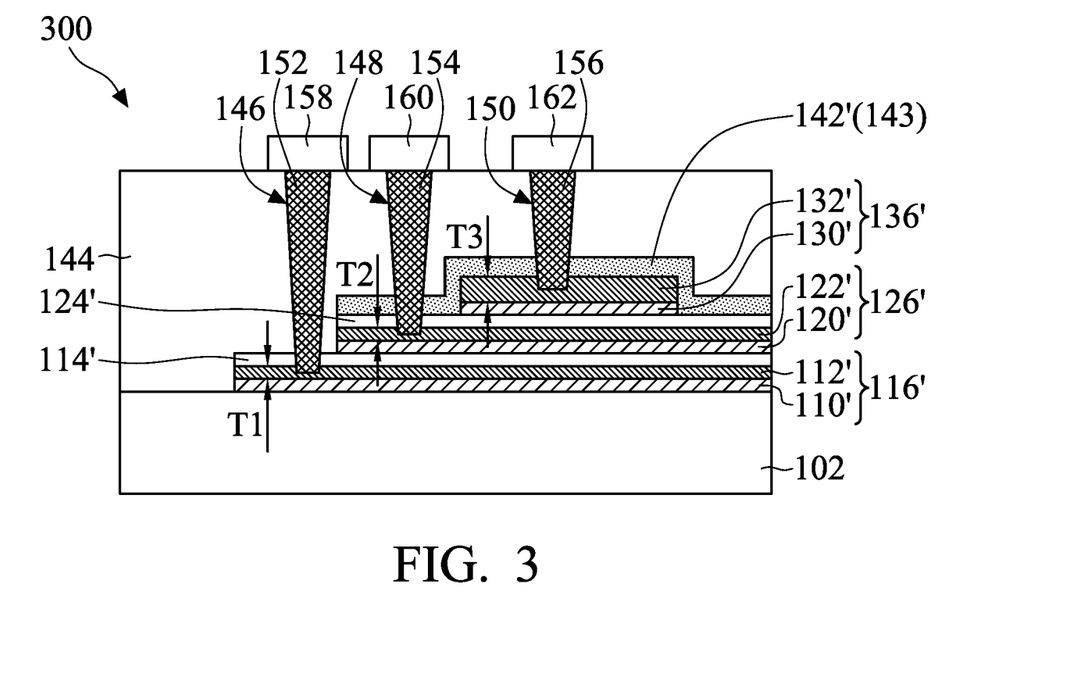

FIG. 3 is cross-sectional views of a capacitor structure 300 in accordance with some other embodiments of the present disclosure. Elements in FIG. 3 that are the same as those in FIGS. 1A-1H are labeled with the same reference numbers as in FIGS. 1A-1H and are not described again for brevity. The differences between the embodiments shown in FIGS. 3 and 1H are that the etching stop layer 143 of the capacitor structure 300 in FIG. 3 is composed of the second etching stop layer 142', and the third thickness T3 of the third anti-reflective coating 132' is greater than the second thickness T2 of the second anti-reflective coating 122' and the first thickness T1 of the first anti-reflective coating 112'.

In the etching process for forming the openings 146, 148 and 150, the third anti-reflective coating 132' has a higher etching selectivity than the IMD layer 144. For example, the etching selective ratio of the third anti-reflective coating 132' to the IMD layer 144 is from about 3 to about 10, and thus the third anti-reflective coating 132' may act as an etching stop layer. Therefore, in the embodiments as shown in FIG. 3, it is possible not to form the first etching stop layer 140' as shown in FIG. 1H, and the etching stop layer 143 is composed of the second etching stop layer 142'. The third anti-reflective coating 132' is formed to have the third thickness T3 which is greater than the second thickness T2 of the second anti-reflective coating 122' and the first thickness T1 of the first anti-reflective coating 112'. For example, the third thickness T3 is from about 1 to about 2.5 times, such as 1.8 times the second thickness T2 and/or the first thickness T1. Therefore, in a case of the same etching time, the difference between the third opening 150 and the first opening 146 and/or the second opening 148 can be compensated by the increase third thickness T3. Therefore, by adjusting the third thicknesses T3 of the third anti-reflective coating 132', the openings 146, 148 and 150 can extend into the corresponding electrode plates 116', 126' and 136' simultaneously without etching through the electrode plates.

Figure 4:
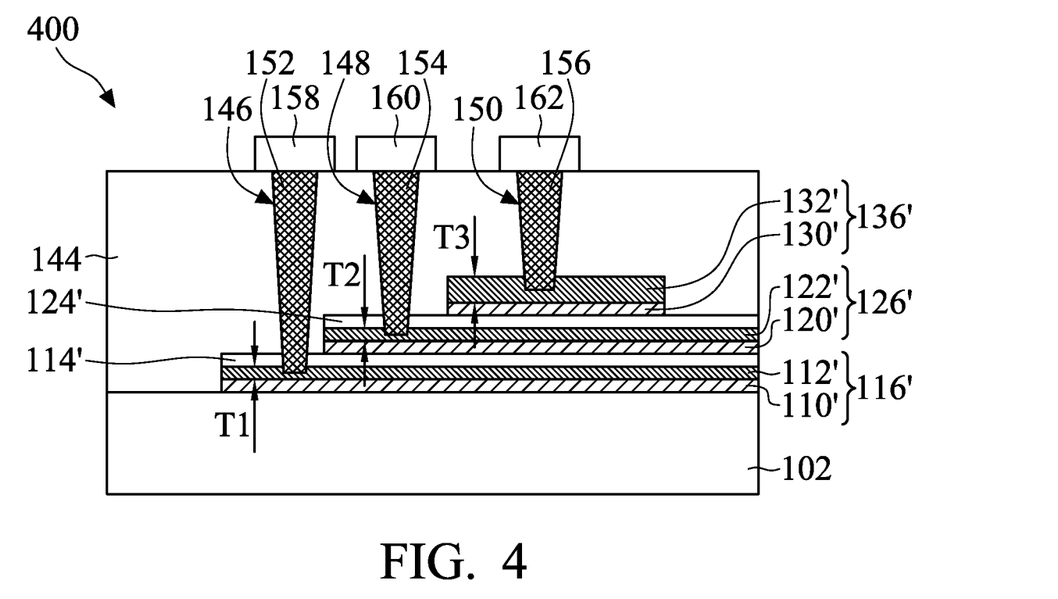

FIG. 4 is cross-sectional views of a capacitor structure 400 in accordance with some other embodiments of the present disclosure. Elements in FIG. 4 that are the same as those in FIGS. 1A-1H are labeled with the same reference numbers as in FIGS. 1A-1H and are not described again for brevity. The differences between the embodiments shown in FIGS. 4 and 1H are that the capacitor structure 400 does not include the etching stop layer 143 as shown in FIG. 1H, and the third thickness T3 of the third anti-reflective coating 132' is greater than the second thickness T2 of the second anti-reflective coating 122 which is greater than the first thickness T1 of the first anti-reflective coating 112'.

As described above, in the etching process for forming the openings 146, 148 and 150, the anti-reflective coating 112', 122' and 132' have higher etching selectivity than the IMD layer 144. For example, the etching selective ratio of the anti-reflective coatings 112', 122' and 132' to the IMD layer 144 is from about 3 to about 10, and thus the anti-reflective coatings 112', 122' and 132' may act as etching stop layers. Therefore, in the embodiments as shown in FIG. 4, it is possible not to form the etching stop layer 143 as shown in FIG. 1H. The third thickness T3 of the third anti-reflective coating 132' is greater than the second thickness T2 of the second anti-reflective coating 122', and the second thickness T2 of the second anti-reflective coating 122' is greater than the first thickness T1 of the first anti-reflective coating 112'. For example, the third thickness T3 is from 1 to 2.5 times, such as 1.8 times the second thickness T2, and the second thickness T2 is from 1 to 2.5 times, such as 1.8 times the first thickness T1 of the first anti-reflective coating 112'. Therefore, in a case of the same etching time, the difference between the first opening 146, second opening 148 and the third opening 150 can be compensated by the difference between the thicknesses T1, T2 and T3 of the anti-reflective coatings 112', 122' and 132'. Therefore, by adjusting the thicknesses T1, T2 and T3 of the anti-reflective coatings 112', 122' and 132', the first opening 146, the second opening 148 and the third opening 150 can extend into the corresponding electrode plates 116', 126' and 136' simultaneously without etching through the electrode plates.

Figure 5:
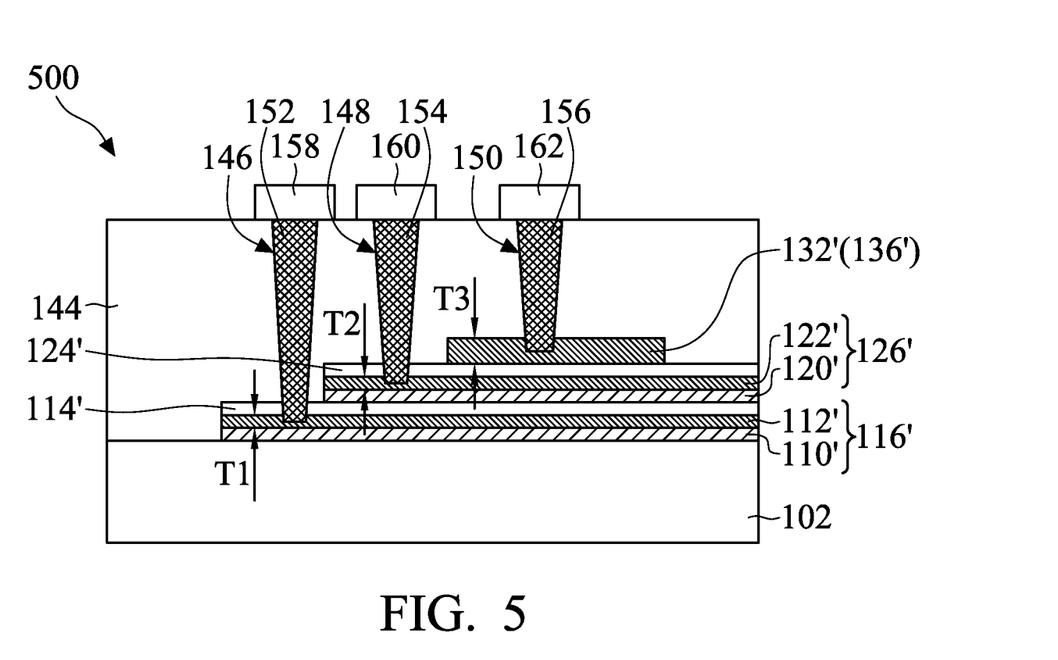

FIG. 5 is cross-sectional views of a capacitor structure 500 in accordance with some other embodiments of the present disclosure. Elements in FIG. 5 that are the same as those in FIGS. 1A-1H are labeled with the same reference numbers as in FIGS. 1A-1H and are not described again for brevity. The difference between the embodiments shown in FIGS. 5 and 4 is that the third electrode plate 136' of the capacitor structure 500 in the FIG. 5 is composed of the third anti-reflective coating 132'.

As described above, the material of the third anti-reflective coating 132' of the third electrode plate 136' is a metal nitride with conductivity, such as TiN, TaN or the like. Therefore, in the embodiments as shown in FIG. 5, the third electrode plate 136' may not include a metal layer, such as the third metal layer 130' in FIG. 1H and the third electrode plate 136' is only composed of the third anti-reflective coating 132'. Without forming the third metal layer 130', the overall thickness of the capacitor structure 500 can be reduced, which helps to reduce difficulties and complexities of integrating the capacitor structure 500 into front-end-of-line (FEOL) processes of the complementary metal oxide semiconductor (CMOS).

Figure 6:
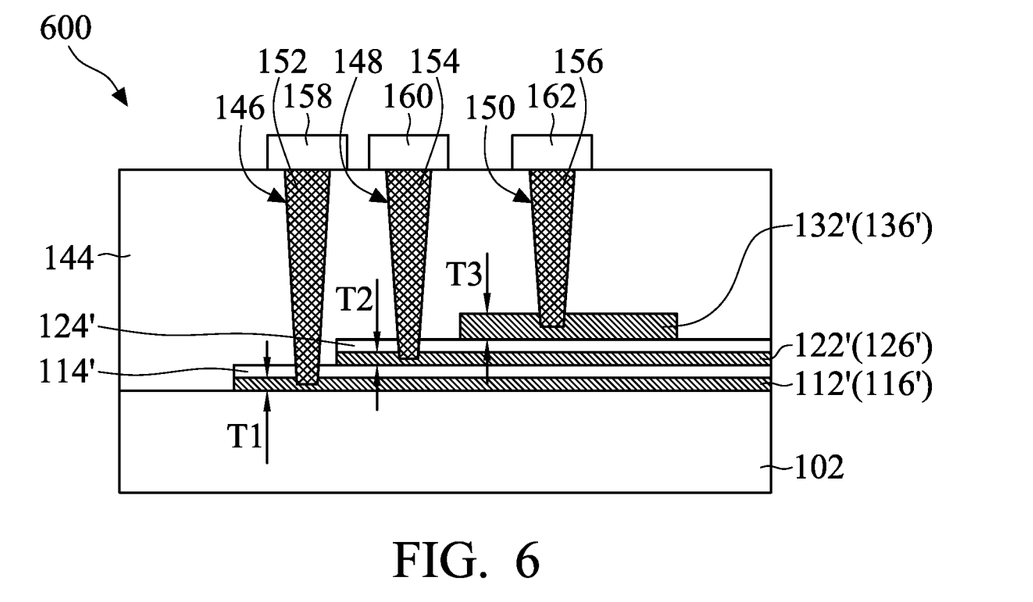

FIG. 6 is cross-sectional views of a capacitor structure 600 in accordance with some other embodiments of the present disclosure. Elements in FIG. 6 that are the same as those in FIGS. 1A-1H are labeled with the same reference numbers as in FIGS. 1A-1H and are not described again for brevity. The differences between the embodiments shown in FIGS. 6 and 4 are that the first electrode plate 116' is composed of the first anti-reflective coating 112', the second electrode plate 126' is composed of the second anti-reflective coating 122', and the third electrode plate 136' is composed of the third anti-reflective coating 132', as shown in FIG. 6.

As described above, the material of the anti-reflective coating 112', 122' and 132' are a metal nitride with conductivity, such as TiN, TaN or the like. Therefore, in the embodiments as shown in FIG. 6, the electrode plates 116', 126' and 136' may not include metal layers, such as the metal layers 110', 120' and 130' in FIG. 4. The electrode plates 116', 126' and 136' may be composed of the anti-reflective coating 112', 122' and 132' respectively. Without forming the metal layer 110', 120' and 130', the overall thickness of the capacitor structure 600 can be reduced, which helps to reduce difficulties and complexities of integrating the capacitor structure 500 into front-end-of-line (FEOL) processes of the complementary metal oxide semiconductor (CMOS).

In summary, the embodiments of the present disclosure adjust thicknesses of etching stop layers formed on electrode plates and/or anti-reflective coating of electrode plates, which are increased as the layer-levels of the electrode plates are increased, and thus in a cases where the etching time is the same, the difference between the etching depths can be compensated for by the difference between the thicknesses of etching stop layers formed on electrode plates and/or between the thicknesses of anti-reflective coatings of electrode plates. Therefore, the embodiments of the present disclosure can use one etching process to form multiple via openings having different depths to respective electrode plates, which may reduce the time and costs of forming capacitor structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A capacitor structure, comprising:
   a first electrode plate disposed on a substrate;
   a first capacitor dielectric layer disposed on the first electrode plate;
   a second electrode plate disposed on the first capacitor dielectric layer, wherein the second electrode plate includes a first metal layer and a first anti-reflective coating disposed on the first metal layer, wherein a portion of the first electrode plate extends beyond an end of the second electrode plate to form a step;
   a second capacitor dielectric layer disposed on the second electrode plate;
   a third electrode plate disposed on the second capacitor dielectric layer, wherein the third electrode plate includes a second metal layer and a second anti-reflective coating disposed on the second metal layer, and a thickness of the second anti-reflective coating is greater than a thickness of the first anti-reflective coating, wherein a portion of the second electrode plate extends beyond an end of the third electrode plate to form another step;
   an etching stop layer including a first portion and a second portion, wherein the first portion of the etching stop layer is disposed on the portion of the second electrode plate which extends beyond the third electrode plate, the second portion of the etching stop layer is disposed on the third electrode plate, and a thickness of the first portion of the etching stop layer is less than a thickness of the second portion of the etching stop layer,
   an inter-metal dielectric layer which covers the etching stop layer, the second electrode plate, the first capacitor dielectric layer, the first electrode plate, the second capacitor dielectric layer, and third electrode plate;
   a first via which penetrates through the inter-metal dielectric layer to contact the first electrode plate at the portion extending beyond the second electrode plate;
   a second via which penetrates through the inter-metal dielectric layer and the first portion of the etching stop layer to contact the second electrode plate; and
   a third via which penetrates through the inter-metal dielectric layer and the second portion of the etching stop layer to contact the third electrode plate.

2. The capacitor structure as claimed in claim 1, wherein the first portion of the etching stop layer includes a first etching stop layer, and the second portion of the etching stop layer includes the first etching stop layer and a second etching stop layer disposed on the first etching stop layer.

3. The capacitor structure as claimed in claim 1, wherein a material of the etching stop layer is silicon oxide, silicon nitride, silicon oxynitride, or a combination thereof.

4. The capacitor structure as claimed in claim 1, wherein a material of the first anti-reflective coating and the second anti-reflective coating is a metal nitride.

5. The capacitor structure as claimed in claim 1,
wherein the second electrode plate includes a first metal layer and a first anti-reflective coating disposed on the first metal layer,
wherein the third electrode plate is composed of a second anti-reflective coating.

6. A capacitor structure, comprising:
   a first electrode plate disposed on a substrate, wherein the first electrode plate includes a first anti-reflective coating;
   a first capacitor dielectric layer disposed on the first electrode plate;
   a second electrode plate disposed on the first capacitor dielectric layer, wherein a portion of the first electrode plate extends beyond an end of the second electrode plate to form a step, and wherein the second electrode plate includes a second anti-reflective coating, and wherein a thickness of the second anti-reflective coating is less than a thickness of the first anti-reflective coating;
   a second capacitor dielectric layer disposed on the second electrode plate;
   a third electrode plate disposed on the second capacitor dielectric layer, wherein a portion of the second electrode plate extends beyond an end of the third electrode plate to form another step, wherein the third electrode plate includes a third anti-reflective coating, and a thickness of the third anti-reflective coating is greater than the thickness of the second anti-reflective coating;
   an inter-metal dielectric layer which covers the second electrode plate, the first capacitor dielectric layer and the first electrode plate;
   a first via which penetrates through the inter-metal dielectric layer to contact the first electrode plate at the portion extending beyond the second electrode plate;
   a second via which penetrates through the inter-metal dielectric layer to contact the second electrode plate; and
   a third via which penetrates through the inter-metal dielectric layer to contact the third electrode plate.

7. The capacitor structure as claimed in claim 6, further comprising:
   an etching stop layer disposed on the portion of the first electrode plate which extends beyond the second electrode plate and on the second electrode plate, wherein the first via and the second via further penetrate through the etching stop layer.

8. The capacitor structure as claimed in claim 6,
wherein the first electrode plate further includes a first metal layer, and the first anti-reflective coating is disposed on the first metal layer,
wherein the second electrode plate further includes a second metal layer, and the second anti-reflective coating is disposed on the second metal layer.

9. The capacitor structure as claimed in claim 6,
wherein the first electrode plate further includes a first metal layer, and the first anti-reflective coating is disposed on the first metal layer,
wherein the second electrode plate is composed of the second anti-reflective coating.

10. The capacitor structure as claimed in claim 6,
wherein the first electrode plate is composed of the first anti-reflective coating
wherein the second electrode plate is composed of the second anti-reflective coating.

11. A method for fabricating a capacitor structure, comprising:

sequentially forming a first electrode plate material layer, a first dielectric layer, a second electrode plate material layer, a second dielectric layer, a third electrode material layer and a first etching stop layer on a substrate;

patterning the first etching stop layer, the third electrode material layer and the second dielectric layer to form a patterned first etching stop layer, a third electrode plate and a second capacitor dielectric layer, respectively;

forming a second etching stop layer over the patterned first etching stop layer and the second electrode plate material layer;

patterning the second etching stop layer and the second electrode plate material layer to form a patterned second etching stop layer and a second electrode plate respectively, wherein a portion of the second electrode plate extends beyond an end of the third electrode plate to form a step;

patterning the first dielectric layer and the first electrode plate material layer to form a first capacitor dielectric layer and a first electrode plate respectively, wherein a portion of the first electrode plate extends beyond an end of the second electrode plate to form a step;

forming an inter-metal dielectric layer to cover the patterned first etching stop layer, the second electrode plate, the first capacitor dielectric layer, the first electrode plate, the patterned second etching stop layer, the third electrode plate, and the second capacitor dielectric layer;

forming a first opening to penetrate through the inter-metal dielectric layer until the portion of the first electrode plate which extends beyond the second electrode plate is exposed;

forming a second opening to penetrate through the inter-metal dielectric layer and the patterned second etching stop layer until the portion of the second electrode plate which extends beyond the third electrode plate is exposed; and forming a first via in the first opening and a second via in the second opening.

12. The method as claimed in claim 11, wherein the first opening and the second opening are formed in a same etching process.

13. The method as claimed in claim 11, further comprising:

forming a third opening to penetrate through the inter-metal dielectric layer, the patterned first etching stop layer and the patterned second etching stop layer until the third electrode plate is exposed, wherein the first opening, the second opening and the third opening are formed in a same etching process, and forming a third via in the third opening.

14. The method as claimed in claim 11, wherein the second electrode plate material layer includes a first metal layer and a first anti-reflective coating disposed on the first metal layer, wherein the third electrode plate material layer includes a second metal layer and a second anti-reflective coating disposed on the second metal layer, and a thickness of the second anti-reflective coating is equal to or greater than a thickness of the first anti-reflective coating.

15. The method as claimed in claim 11, wherein the second electrode plate material layer includes a first metal layer and a first anti-reflective coating disposed on the first metal layer, wherein the third electrode material layer is composed of a second anti-reflective coating.

* * * * *